United States Patent
Xalter et al.

(10) Patent No.: US 8,018,664 B2
(45) Date of Patent: Sep. 13, 2011

(54) HOUSING STRUCTURE

(75) Inventors: Stefan Xalter, Oberkochen (DE); Peter Deufel, Aalen (DE); Yim Bun Patrick Kwan, Aalen (DE); Bernard Stommen, Geldrop (NL); Herman Soemers, Mierlo (NL); Franz Van Deuren, Valkenswaard (NL); Paul Peter Anne Brom, Eindhoven (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 626 days.

(21) Appl. No.: 10/598,014

(22) PCT Filed: Apr. 20, 2004

(86) PCT No.: PCT/EP2004/004235
§ 371 (c)(1),
(2), (4) Date: May 5, 2009

(87) PCT Pub. No.: WO2005/083487
PCT Pub. Date: Sep. 9, 2005

(65) Prior Publication Data
US 2009/0303626 A1 Dec. 10, 2009

(30) Foreign Application Priority Data
Feb. 26, 2004 (DE) .................. 10 2004 009 243

(51) Int. Cl.
G02B 7/02 (2006.01)
(52) U.S. Cl. ....................................... 359/811; 359/815

(58) Field of Classification Search ................. 359/811, 359/812, 815–819, 820, 821
See application file for complete search history.

(56) References Cited

U.S. PATENT DOCUMENTS

| | | | |
|---|---|---|---|
| 6,031,598 A | 2/2000 | Tichenor et al. | |
| 6,095,697 A * | 8/2000 | Lehman et al. | 385/88 |
| 6,147,818 A | 11/2000 | Hale et al. | |
| 6,325,351 B1 | 12/2001 | Hale et al. | |
| 6,449,106 B1 * | 9/2002 | Spinali | 359/811 |
| 2002/0163741 A1 | 11/2002 | Shibazaki | |
| 2003/0058422 A1 | 3/2003 | Loopstra et al. | |

FOREIGN PATENT DOCUMENTS

| | | |
|---|---|---|
| EP | 1 278 089 A2 | 1/2003 |
| EP | 1 321 823 A2 | 6/2003 |
| JP | 10-253872 | 9/1998 |
| JP | 2002-072120 | 3/2002 |
| JP | 2003-158070 | 5/2003 |
| WO | 2005/026801 A2 | 3/2005 |

OTHER PUBLICATIONS

"Catalog 2003"—2003, LINOS, XP002300333, pp. N2, L2.
The Japanese Office Action, with English translation, for corresponding JP Application No. 2007-500060, dated Mar. 29, 2011.

* cited by examiner

*Primary Examiner* — Ricky Mack
*Assistant Examiner* — Vipin Patel
(74) *Attorney, Agent, or Firm* — Fish & Richardson P.C.

(57) ABSTRACT

A housing structure has a frame structure 1 on which there are arranged via connecting elements 7 several optical elements 5 which are held in mounts 6 or structural modules 6'. The optical elements 5 are detachably connected to the frame structure 1 with their mounts 6 or structural modules 6' and connecting elements 7 in such a way that in the installed state they are integrated as bearing units in the frame structure 1.

14 Claims, 5 Drawing Sheets

HOUSING STRUCTURE

BACKGROUND OF THE INVENTION

1. Field of the Invention

The invention relates to a housing structure which has a frame structure on which there are arranged via connecting elements several optical elements which are held in mounts or structural modules.

2. Description of the Prior Art

A housing structure of this type is described, for example, in EP 1 278 089 A2. It has frame parts and connecting plates on which several optical elements are fastened, bores or openings being provided in part for this purpose. The housing structure forms a stable self-supporting unit. Appropriate auxiliary constructions with fastening elements are required for fastening the optical elements with their mounts or structural modules. The mounting is relatively complicated, and an additional installation space is required for the connection. The optical elements connected to the frame structure constitute virtually separate parts on the housing structure and have little dynamic influence on the housing structure. Moreover, thermal influences and influences of internal stress are difficult to calculate.

SUMMARY OF THE INVENTION

The object of the present invention is to avoid the above-named disadvantages of the prior art, in particular to create a housing structure, there being a simpler and reproducible connection between the housing structure and the optical elements arranged therein.

This object is achieved according to the invention when the optical elements are detachably connected to the frame structure with their mounts or structural modules and connecting elements in such a way that in the installed state they are integrated as bearing units in the frame structure.

The inventive design results in a uniform mechanical support structure both for the housing structure with its frame structure, and for the optical elements with their mounts and structural modules in addition to connecting elements. The optical elements therefore make a kinematic contribution to the stability or stiffness of the housing structure. This means that without the optical elements inserted the housing structure alone is not self-supporting or sufficiently stable, but that an integral load-bearing unit results after installation of the optical elements.

In addition to a saving of material and weight and of installation space, a clearer and reproducible connection is created in this way between the frame structure and the optical elements. The individual optical elements, which are arranged either individually in a mount, or else in subgroups or in structural modules, can be separately constructed, preadjusted and tested and be installed in the frame structure as appropriately prefabricated units only after this, and be appropriately adjusted in the process.

The optical elements are preferably supported in kinematically determined fashion. This can be performed, for example, by setting members which can be adjusted in six degrees of freedom. A hexapod, for example, is suitable for this purpose.

BRIEF DESCRIPTION OF THE DRAWINGS

Further advantageous refinements and developments emerge from the subclaims and from the following exemplary embodiments described in principle with the aid of the drawings, in which:

DETAILED DESCRIPTION OF THE PREFERRED EMBODIMENTS

Figure 1:
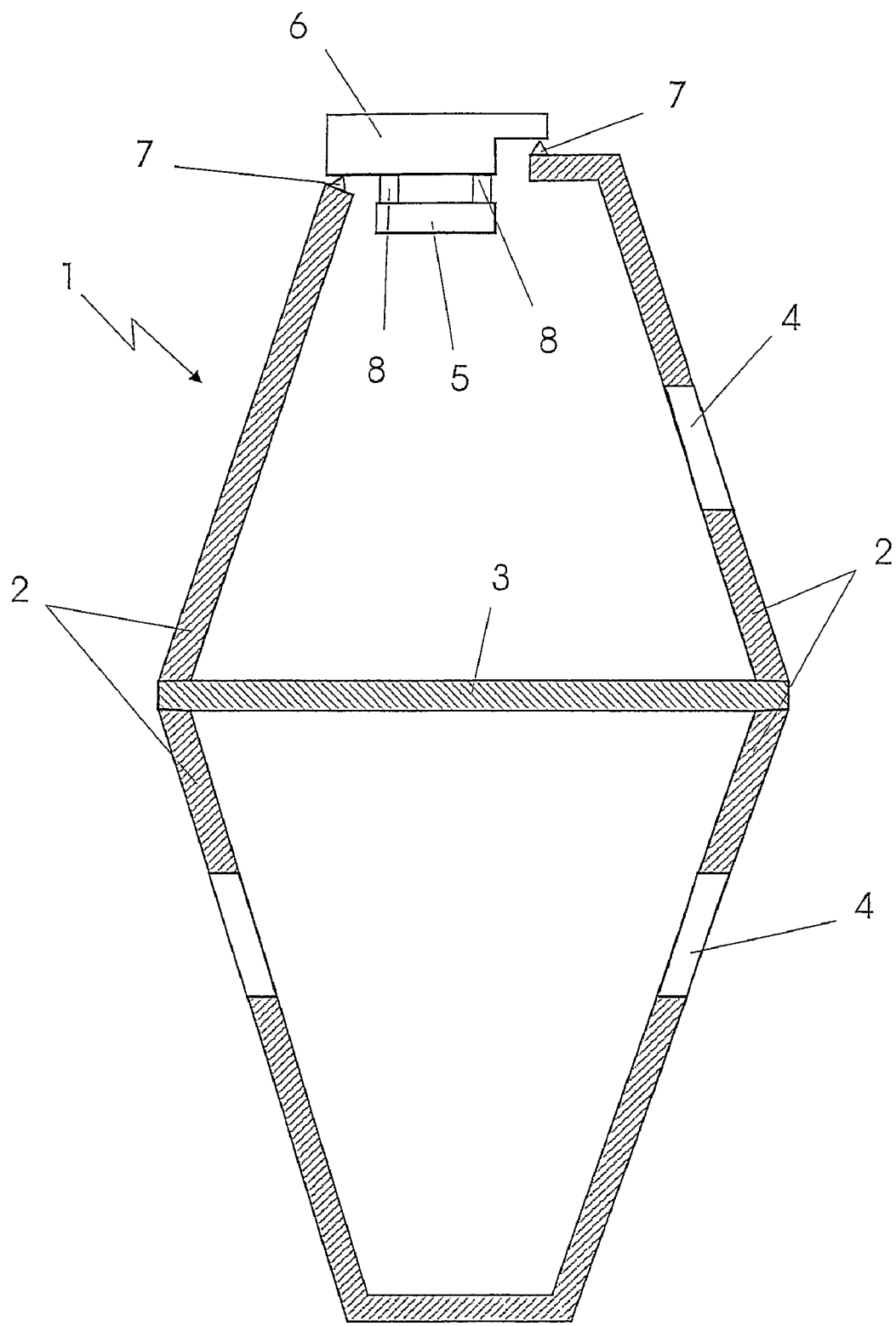
FIG. 1 shows an illustration of the principle of a housing structure with an inserted optical element.
Figure 2:
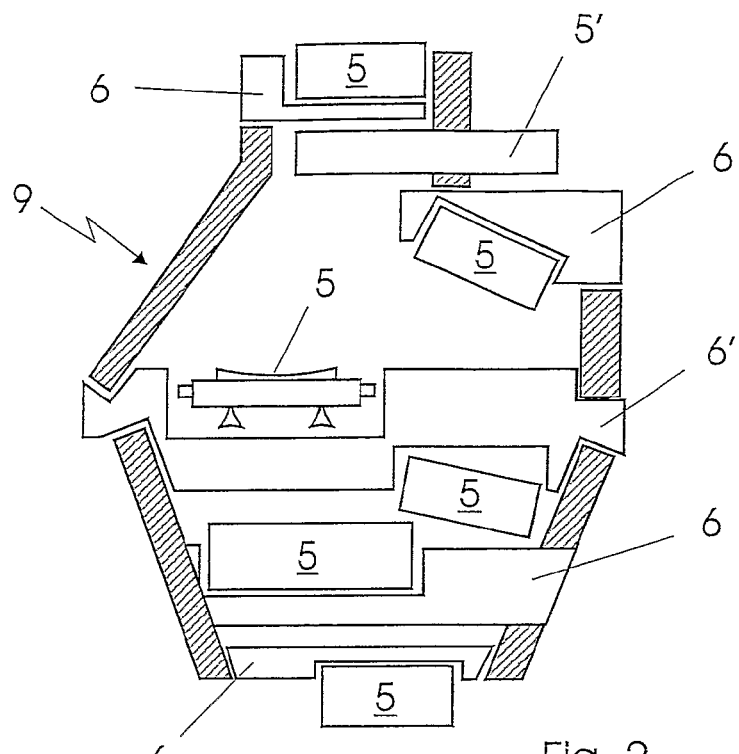
FIG. 2 shows a further configuration of a frame structure with a multiplicity of optical elements.

The housing structure illustrated in FIGS. 1 and 2 has a frame structure 1 which is assembled from several frame parts 2 and reinforcing plates 3. The frame structure 1 is provided with a multiplicity of cutouts or openings 4. Optical elements 5 with their mounts 6 are inserted into the openings 4. Connecting elements 7 (not illustrated in more detail) are provided for this purpose. Setting members or actuators 8 are arranged between the mount 6, which can be constructed as a base element, and the optical element 5, for example, a mirror 5. The arrangement and configuration of the setting members 8 are not described in more detail below, since they are known in principle. The setting members 8 should as far as possible permit adjustments of the optical element 5 in six degrees of freedom, and can be constructed for this purpose as hexapods, for example.

FIG. 2 shows a housing structure which can be, for example, an objective housing 9 of a projection objective in microlithography, as is described, for example, in more detail in EP 1 278 089 A2. The projection objective 9 can be provided, for example, for EUV lithography for which extremely high demands are placed on accuracy. In this case, the optical elements constitute mirrors 5, for example, "5" indicating a stop. As may be seen from FIG. 1 in the upper area, and from FIG. 2, a multiplicity of optical elements 5 with their mounts 6 are inserted into the openings 4 in the frame structure 1. The connecting elements 7 and the mounts 6 are configured in such a way that in the illustrated installed state of the optical elements 5 with their mounts 6 these form a bearing unit with the frame structure 1 or are integrated in the latter in such a way that a stable unit of great rigidity is created in this way.

Figure 3:
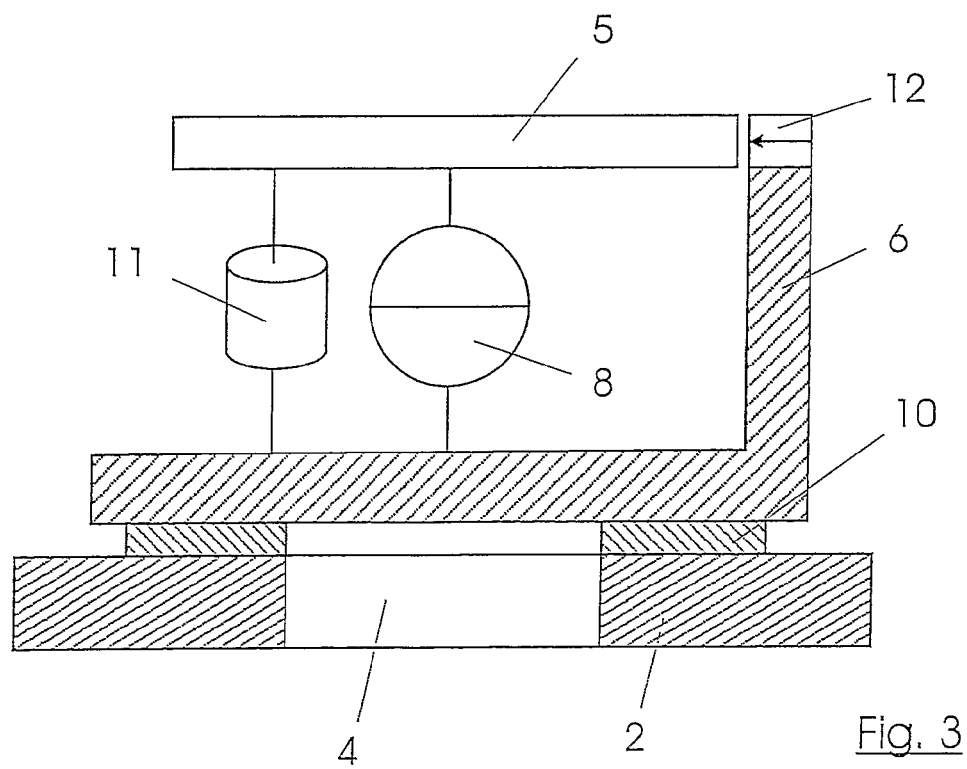
FIG. 3 shows a detail of the housing structure with an optical element supported in a mount.

FIG. 3 shows in an enlarged illustration a detail of the frame structure 1 with a frame part 2 to which the mount 6 of the optical element, constructed as a mirror 5, for example, is connected via adapting elements (spacer) 10. A gravity compensator 11 can be arranged between the optical element 5 and the mount 6. The gravity compensator 11 serves the purpose of reducing the weight of the optical element 5 so that the setting members or actuators 8 need to apply smaller forces in order to adjust the optical element 5. Lorenz actuators or piezoelectric elements, for example, can be provided as actuators 8. One or more actuators are provided in each case as setting members 8 for the purpose of adjusting an optical element 5. Furthermore, the mount 6 is provided with sensors 12 for determining the position of the optical element 5. The application U.S. 60/502,334 contains further information on this. It is a part of this application in its entirety.

Instead of simple mounts 6 for each optical element 5, it is also possible, of course, to provide structural modules 6' as so-called subgroups, if required, several optical elements 5 being held in a structural module, as is indicated, for example, in FIG. 2 by the structural module 6'. As may be seen, in this case the structural module 6' provides a transverse connection between the laterally opposite frame parts 2, and lends the frame structure 9 a high degree of stability in this way.

The frame parts 2 of the frame structure 1, the mounts 6 and the structural modules 6' should consist of a material with at least approximately the same coefficients of thermal expansion so that no internal stresses are introduced, particularly in the case of the occurrences of heating that occur in EUV lithography. For the same reason, materials with very low coefficients of thermal expansion should also be used such as, for example, glass ceramics (Zerodur® from Schott Glas).

Figure 4:
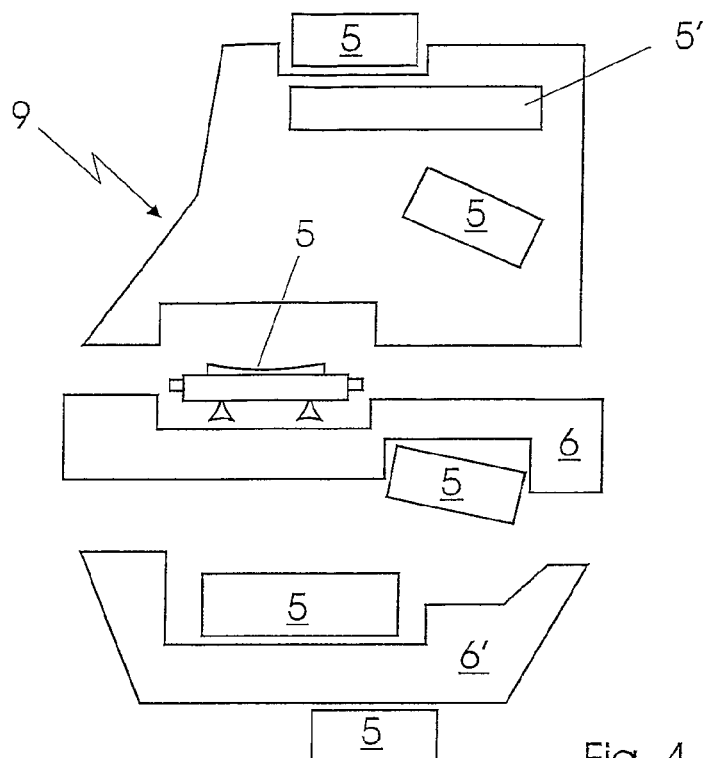
FIG. 4 shows a frame structure in an exploded fashion.
Figure 5:
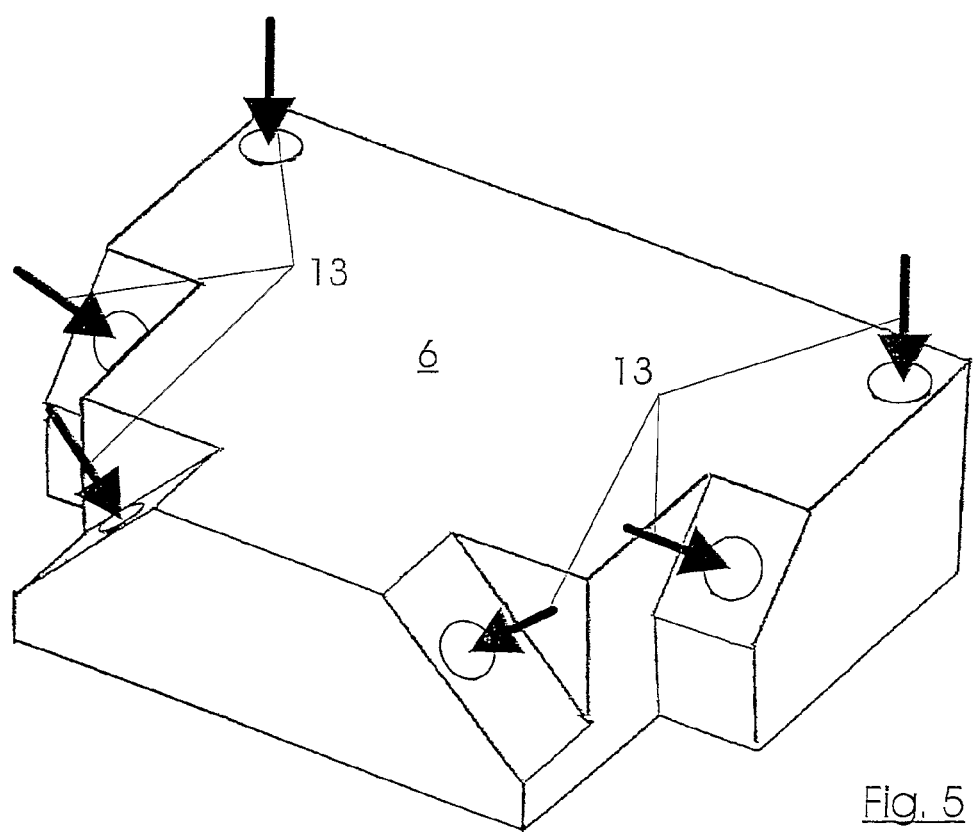
FIGS. 5-8 show various mounts/structural modules with fastening points.
Figure 6:
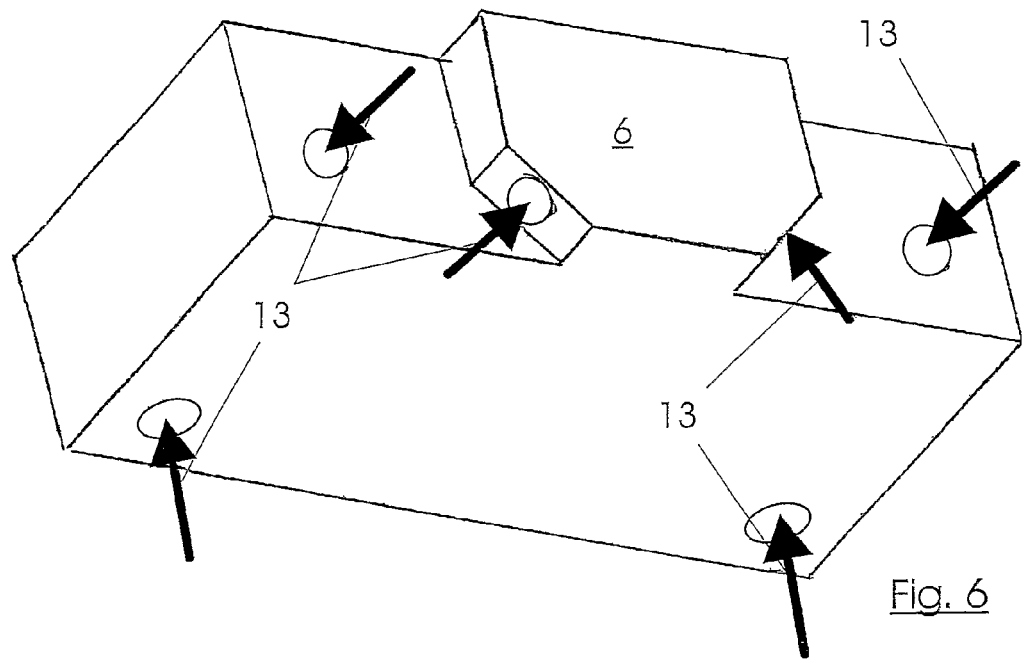
Figure 7:
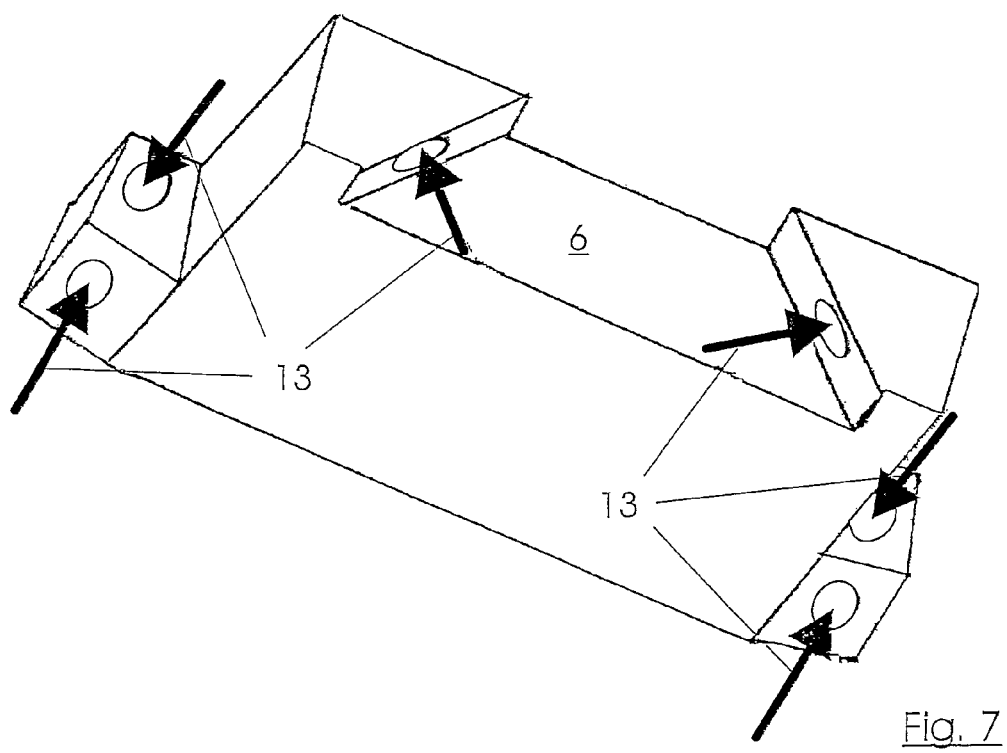
Figure 8:
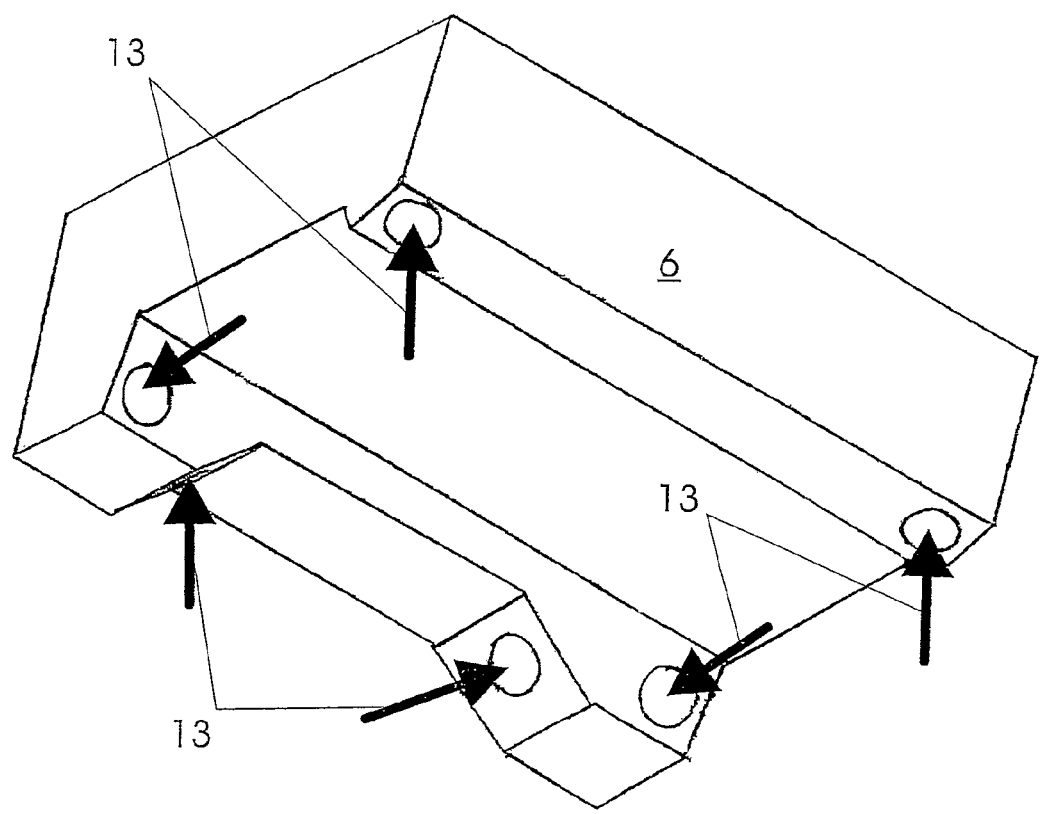

FIG. 4 shows a frame structure 9 in a modification of FIG. 2. As may be seen, the frame structure 9 is split into several parts, the optical elements with their mounts 6 or structural modules 6' being integrated in the individual components. After appropriate preadjustment, the individual components 9 are then combined in relation to the frame structure 9 so as to form an integral bearing unit.

Various examples of mounts 6 and/or structural modules are illustrated in FIGS. 5 to 8, with in each case six fastening points for connecting to the frame structure 1. The optical elements 5, which are respectively connected to the mount 6 via actuators 8, are not illustrated here.

The arrows indicate the degree of freedom with which a connecting point is respectively rigidly connected to the frame structure 1. The connecting point is formed to be "softly" in the respective other directions or degrees of freedom. This configuration leads to a so-called kinematic bearing with six degrees of freedom and six supported directions.

As illustrated by the arrows 13, the support directions will advantageously be selected in this case in such a way that they lie respectively in the plane of an associated plate or strut of the frame structure 1.

The course of the arrows 13, and thus of the force direction, is therefore determined in each case by the position and/or site of installation on the frame structure 1, and by the course of the frame structure or frame strut or frame plate at this point.

The six degrees of freedom relate to translations in three coordinate directions, and to rotations about each of the three axes of rotation laid through their centroid. This means that in total six movements are possible, specifically linear movements in terms of the three components in the axial direction of the spatial coordinate system, and rotary movements in terms of the three components of the rotation about the three axes of rotation.

FIGS. 5 to 8 respectively show the same principle of connection with the force directions. The directions of the arrows 13 for the six degrees of freedom are a function only of the position of installation, which is shown in FIGS. 5 to 8 only by way of example for different positions.

We claim:

1. Housing structure which has a frame structure on which there are arranged via connecting elements several optical elements which are held in mounts or structural modules, wherein:
   the optical elements are detachably connected to the frame structure with their mounts or structural modules and connecting elements;
   when the optical elements with their mounts or structural modules and connecting elements are installed in the frame structure, the housing structure is an integral load-bearing unit;
   when the optical elements with their mounts or structural modules and connecting elements are not installed in the frame structure, the frame structure is not self-supporting; and
   the frame structure and the mounts or structural modules with their connecting elements have at least approximately the same coefficient of thermal expansion.

2. Housing structure according to claim 1, wherein the optical elements are supported on mounts in the form of base elements.

3. Housing structure according to claim 1, wherein the mounts or structural modules are provided with setting members.

4. Housing structure according to claim 3, wherein actuators are provided as setting members between the optical elements and their mounts or structural modules.

5. Housing structure according to claim 3, wherein the optical elements can be adjusted in six degrees of freedom by the setting members.

6. Housing structure according to claim 2, wherein adapting elements are arranged between the base elements and the frame structure.

7. Housing structure according to claim 1, wherein the mounts or structural modules are connected rigidly to the frame structure in six degrees of freedom via their connecting elements.

8. Housing structure according to claim 7, wherein at least some of the force directions of the six degrees of freedom are located in a plate plane or strut plane of the frame structure.

9. Housing structure according to claim 1, wherein gravity compensators are arranged between the optical elements and the mounts or the structural modules.

10. Housing structure according to claim 1, wherein the frame structure, the mounts or structural modules and the connecting elements consist of materials with a low coefficient of thermal expansion.

11. Housing structure according to claim 1, configured as an objective housing for a projection objective in microlithography.

12. Housing structure according to claim 11, wherein the objective housing is provided for EUV lithography.

13. Housing structure according to claim 12, wherein mirrors are provided in the objective housing as optical elements.

14. Housing structure which has a frame structure on which there are arranged via connecting elements several optical elements which are held in mounts or structural modules, wherein:
   the optical elements are detachably connected to the frame structure with their mounts or structural modules and connecting elements;
   when the optical elements with their mounts or structural modules and connecting elements are installed in the frame structure, the optical elements with their mounts or structural modules and connecting elements are integrated as stiffness contributing units in the frame structure; and
   when the optical elements with their mounts or structural modules and connecting elements are not installed in the frame structure, the frame structure is not self-supporting.

* * * * *